United States Patent [19]
Yamashita et al.

[11] Patent Number: 5,742,716
[45] Date of Patent: Apr. 21, 1998

[54] LIGHT TRIGGER THYRISTOR

[75] Inventors: Junichiro Yamashita; Takeshi Nakamura, both of Tokyo; Kazunori Taguchi, Fukuoka; Katsumi Satoh, Tokyo, all of Japan

[73] Assignee: Mitsubishi Denki Kabushiki Kaisha, Tokyo, Japan

[21] Appl. No.: 745,921

[22] Filed: Nov. 8, 1996

[30] Foreign Application Priority Data

Jun. 14, 1996 [JP] Japan .................................. 8-154014

[51] Int. Cl.$^6$ .................................................. G02B 6/32
[52] U.S. Cl. .................. 385/33; 385/27; 385/49; 385/88
[58] Field of Search .................... 362/32; 385/15, 385/31, 33, 34, 38, 39, 43, 49, 88, 92, 93, 147, 27

[56] References Cited

U.S. PATENT DOCUMENTS

| | | | |
|---|---|---|---|
| 4,167,746 | 9/1979 | Storm | 385/49 X |
| 4,207,583 | 6/1980 | Temple | 385/27 X |
| 4,500,164 | 2/1985 | Kiyohara | 385/43 |
| 4,757,366 | 7/1988 | Salanki et al. | 385/49 X |
| 5,048,911 | 9/1991 | Sang et al. | 385/33 |
| 5,078,468 | 1/1992 | Stone | 385/116 |
| 5,381,495 | 1/1995 | Hu | 385/51 |
| 5,463,534 | 10/1995 | Raven | 362/32 |

FOREIGN PATENT DOCUMENTS

| | | |
|---|---|---|
| 0 021 352 | 1/1981 | European Pat. Off. . |
| 0 619 481 | 10/1994 | European Pat. Off. . |
| 0 677 879 | 10/1995 | European Pat. Off. . |
| 58-27121 | 2/1983 | Japan . |
| 60-182166 | 9/1985 | Japan . |
| 4-320375 | 11/1992 | Japan . |

*Primary Examiner*—John D. Lee
*Attorney, Agent, or Firm*—Oblon, Spivak, McClelland, Maier & Neustadt, P.C.

[57] ABSTRACT

A light trigger thyristor including a light guide (30) held in a receiving metal fitting (11) with a light entering end side of the light guide (30) inserted into one end of a cylindrical sleeve (15). A plano-convex lens (17) is inserted into the other end of the cylindrical sleeve (15) to face a light introducing window (LW). A connector terminal (12) to which step index optical fibers (131, 132) are connected is attached to the metal receiving fitting (11). The light triggering thyristor prevents light from leaking out a bending portion of the light guide (30) to increase the transmission efficiency of light signals, prevents breakdown of the thyristor element due to concentration of the light signals even when light signals entering the light guide (30) are provided through a plurality of optical fibers from a plurality of light sources, and decreases optical loss due to misalignment of the optical axis of the optical transmission system without requiring very accurate adjustment to the relative position of the optical fibers (131, 132) and the light guide (30).

16 Claims, 8 Drawing Sheets

(BACKGROUND ART)

FIG. 14

(BACKGROUND ART)

FIG. 15

(BACKGROUND ART)

POSITION IN DIAMETER
DIRECTION IN INPUT END

FIG. 16

(BACKGROUND ART)

FIG. 17

(BACKGROUND ART)

POSITION IN DIAMETER
DIRECTION IN INPUT END

LIGHT TRIGGER THYRISTOR

BACKGROUND OF THE INVENTION

1. Field of the Invention

The present invention relates to light trigger thyristors, and particularly to a light trigger thyristor having improved transmission efficiency for light signals and preventing concentration of light signals to increase reliability.

2. Description of the Background Art

As compared with thyristors operating with electric signals, the light trigger thyristor which operates with light signals supplied has the advantage that it is free of malfunction due to noise caused by electro-magnetic induction because its main circuit and driving circuit can be electrically insulated.

This advantage produces its demand as power converters for high-voltage DC power transmission. Recently, light trigger thyristors in the 8KV/4000A class using 6-inch Si wafers are manufactured by way of trial to realize compact and reliable large-capacity thyristor modules.

Figure 13:
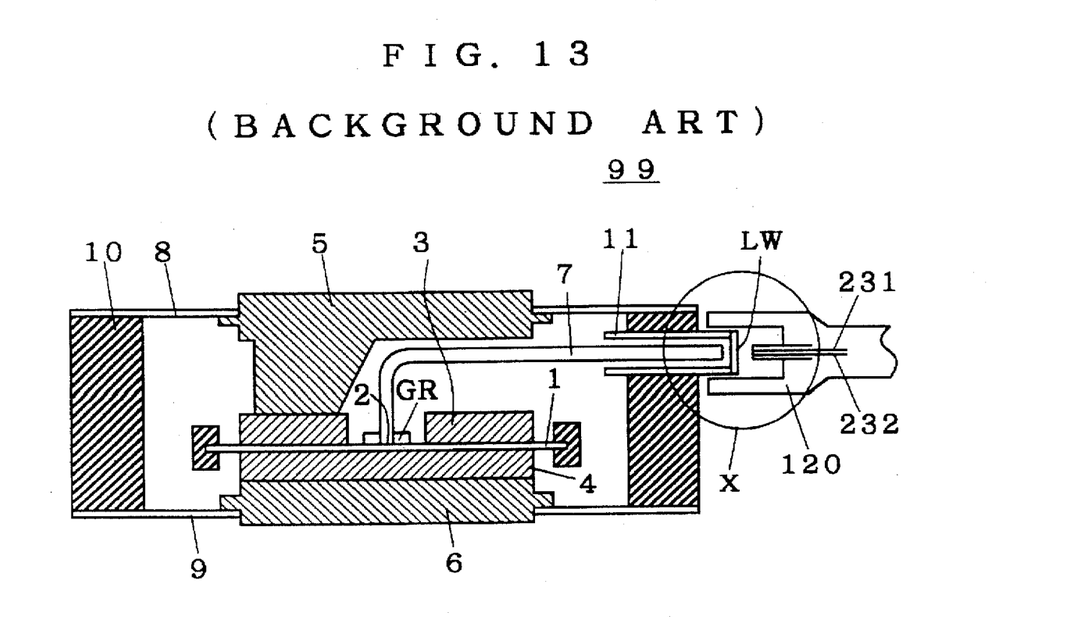
FIG. 13 is a sectional view illustrating the entire structure of a conventional light trigger thyristor.
Figure 14:
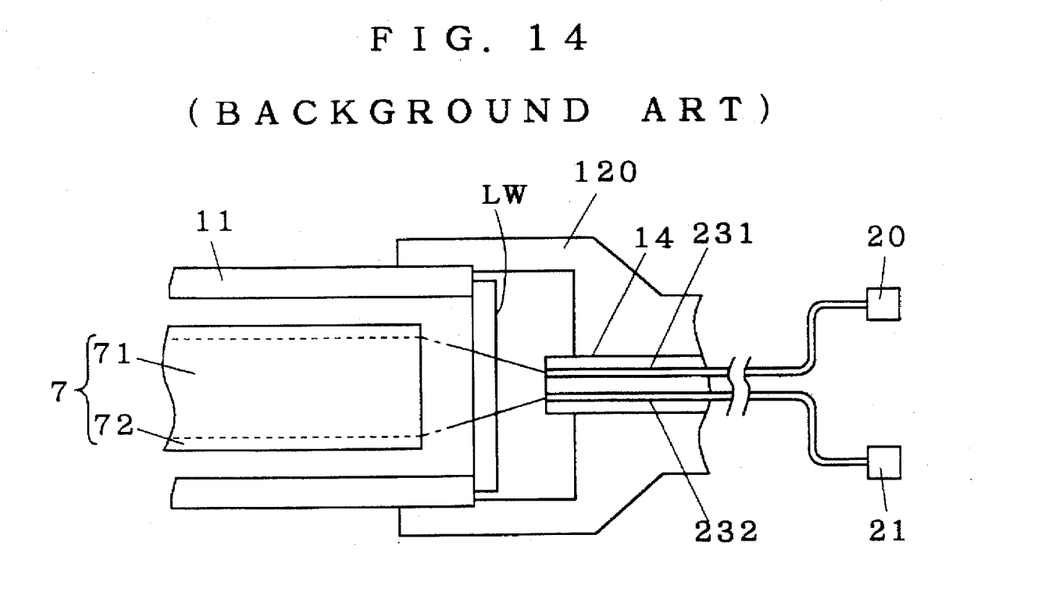
FIG. 14 is a sectional view illustrating structure of a part of the conventional light trigger thyristor.

FIG. 13 is a sectional view of a light trigger thyristor 99 as an example of structure of a conventional light trigger thyristor and FIG. 14 is a diagram showing details of its optical coupling portion.

In FIG. 13, a semiconductor body 1 mainly composed of a semiconductor substrate having a built-in thyristor element has a light receiving portion 2 provided in the center of its upper main surface. A light emitting end of a light guide 7 for transmitting light signals inputted from the outside faces this light receiving portion 2. The light emitting end of the light guide 7 is positioned to the light receiving portion 2 by a guide ring GR.

A first thermal compensator 3 and a second thermal compensator 4 formed of materials having a coefficient of thermal expansion which is approximate to that of the semiconductor body 1 abut on the upper main surface and the lower main surface of the semiconductor body 1. These first and second thermal compensators 3 and 4 are pressure-connected on both main surfaces of the semiconductor body 1 in a so-called alloy-free manner without bonded to the semiconductor body 1 by soldering or the like.

The first and second thermal compensators 3 and 4 are pressed and held by a cathode plate 5 and a anode plate 6, respectively. The cathode plate 5 and the anode plate 6 have their respective bottoms coupled to a casing 10 formed of an electrically insulating material through the circular cathode flange 8 and anode flange 9.

The casing 10 has a hollow cylinder inside to accommodate the semiconductor body 1, the first and second thermal compensators 3 and 4, and the cathode plate 5 and the anode plate 6.

A through hole is formed in the side wall of the casing 10, into which a receiving metal fitting 11 is fixedly inserted. A light transmitting light introducing window LW through which light signals from the outside pass is airtightly fixed to the receiving metal fitting 11. The light guide 7 is inserted into and held by the receiving metal fitting 11 such that its light entering end faces the light introducing window LW. The casing 10 is kept airtight inside with an inert gas sealed therein to prevent characteristic deterioration of the thyristor element.

In this structure, a connector terminal 120 to which optical fibers 231 and 232 are coupled is attached to the receiving metal fitting 11.

FIG. 14 is a diagram showing the details of the area X shown in FIG. 13. As shown in FIG. 14, the light guide 7 is a single optical fiber including a single core portion 71 and a clad portion 72 surrounding it.

In the connector terminal 120, two optical fibers 231 and 232 are held in the ferrule 14 and the ferrule 14 is joined to the connector terminal 120. The optical fibers 231 and 232 are respectively connected to laser diode (LD) modules 20 and 21 which generate light signals.

In the light trigger type thyristor 99 constructed as described above, light signals provided from the LD modules 20 and 21 provided outside are given to the light receiving portion 2 of the semiconductor body 1 through the light guide 7, which are converted into electric signals in the light receiving portion 2 and given to a gate electrode as a gate signal to control switching operation of the main current of the thyristor element.

The conventional light trigger thyristor 99 (FIG. 13) is constructed as stated above, in which light signals are supplied from the LD modules 20 and 21 through the optical fibers 231 and 232. With this structure, even when an abnormality occurs in one of the light sources, the control of the main current of the thyristor element can be continued with light signal from the other light source, which prevents the light signals from being completely interrupted to cause a problem.

Now, the light guide 7 is bent at almost 90° with respect to the light receiving portion 2 as shown in FIG. 13. The optical fiber utilizes a difference in refractive index between the core portion and the clad portion surrounding it to transmit light signals by total reflection at the boundary between the two. If it is bent as shown in FIG. 13, however, the light is not totally reflected at the boundary between the core portion 71 and the clad portion 72 at the bent portion and it leaks out from the clad portion 72. Then, the light signal incident upon the light guide 7 can not be certainly transmitted to the light receiving portion 2, leading to the problem that the minimum power (PLT) for ignition of the thyristor element can not be obtained sufficiently.

A plurality of light signal sources as the LD modules 20 and 21 provide light signals through the optical fibers 231 and 232 for the purpose of accomplishing continued operation with one of the light signal sources even if the other breaks down. When the light signals are given from the LD modules 20 and 21 through the optical fibers 231 and 232, however, the light signals sent out from the optical fibers 231 and 232 are independent light signals having individual light intensity distributions.

Figure 15:
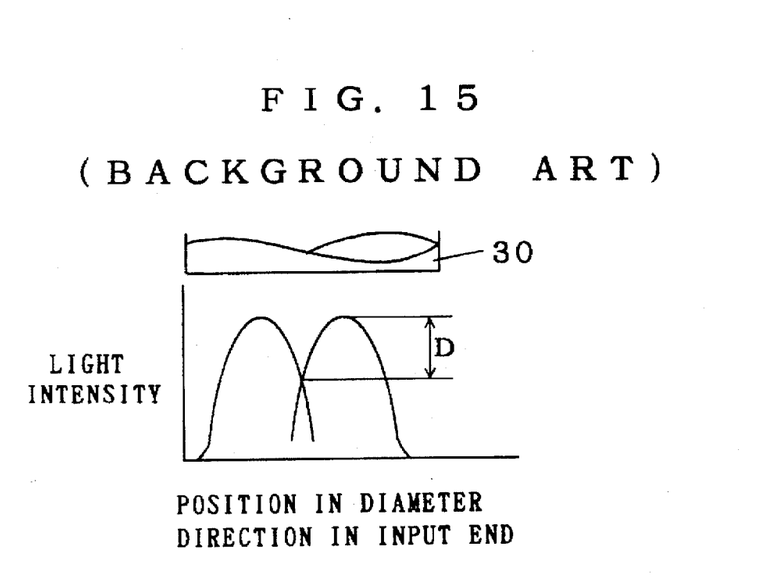
FIG. 15 is a diagram showing the light intensity distribution of light signals incident upon the light guide of the conventional light trigger thyristor.

FIG. 15 shows the light intensity distribution of light signals incident upon the light guide 7. In FIG. 15, the horizontal axis shows the position in the diameter direction of the light entering end of the light guide 7 and the vertical axis shows the light intensity.

As shown in FIG. 15, the light signals emitted from the optical fibers 231 and 232 in FIG. 14 each have the light intensity distribution in which the light intensity is the highest, or has a peak, around the center of the fiber. Since the two are almost independent of each other, the two peaks are separated. The difference between the light intensity in the portion where the two peaks intersect and the light intensity at the top of the peak is represented as an intensity difference D.

Generally, in the optical fibers, a light signal incident at an angle exceeding the critical angle determined by the difference in refractive index between the core portion and the clad portion is not transmitted. Therefore the light signal near the clad portion is attenuated, resulting in uneven light intensity distribution in which the light intensity is the highest around the center of the fiber and the light intensity decreases as it gets closer to the periphery. Especially, in the light trigger thyristors used for power conversion in which the distance from the light source extends to several tens of meters, the amount of attenuation increases and the unevenness of the light intensity distribution also increases.

In this way, applying light signals having two peaks to the light receiving portion 2 of the semiconductor body 1 through the light guide 7 causes uneven photocurrent. Furthermore, if one of the LD modules 20 and 21 stops operating, a photocurrent occurs only in the portion irradiated with the light signal in the light receiving portion 2. Then the main current concentrates only in the portion where the photocurrent occurs, which locally generates heat to break the light receiving portion 2, finally leading to breakage of the thyristor element.

Possible solutions for preventing the thyristor element from being broken by such concentration of light signals include to reduce the light output of the light source with the precision of alignment of optical axis of the light transmission system increased to the limit, and to increase the distances between the radiation planes, i.e., the distance between the light emitting ends of the optical fibers 231 and 232 and the light entering end of the light guide 7 and the distance between the light emitting end of the light guide 7 and the light receiving portion 2 to make the form of the light intensity distribution less steep, by utilizing the spreading angle of the emission from the optical fibers and the light guide. However, both have the problem that the minimum power (PLT) for ignition of the thyristor element can not be obtained sufficiently.

In the light trigger thyristors, it is generally demanded that the light signal does not exceed the maximum power density and the minimum power (PLT) is sufficiently supplied. As have been explained above, however, if the light signals have peaks and the light intensity distribution is uneven, the problem that the maximum power density is high but the minimum power (PLT) can not be obtained sufficiently arises.

When assembling the light trigger thyristor 99, the light entering end side of the light guide 7 is inserted into the receiving metal fitting 11 and then the light emitting end of the light guide 7 is inserted into the guide ring GR. At this time, it is necessary to lift up the light guide 7 in the vertical direction with respect to the semiconductor body 1 at least for the thickness of the guide ring GR. Accordingly, it is necessary to set a clearance corresponding at least to the thickness of the guide ring GR in the inside diameter of the receiving metal fitting 11 and the outside diameter of the light guide 7.

Figure 16:
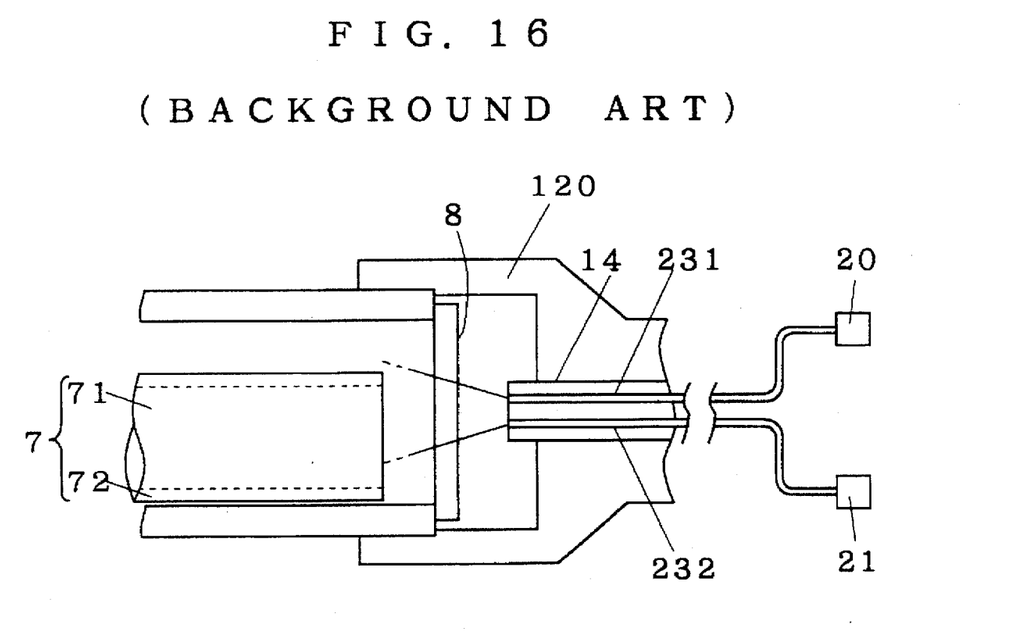
FIG. 16 is a sectional view illustrating a problem of the conventional light trigger thyristor.

However, this clearance causes a shift of the optical axis of the light guide 7. FIG. 16 shows the details of the optical coupling portion with the optical axis of the light guide 7 shifted.

As shown in FIG. 16, if the light guide 7 is shifted in position to come into contact with the inner wall of the receiving metal fitting 11, for example, part of the light signals sent out from the optical fibers 231 and 232 does not strike the light entering end of the light guide 7.

Figure 17:
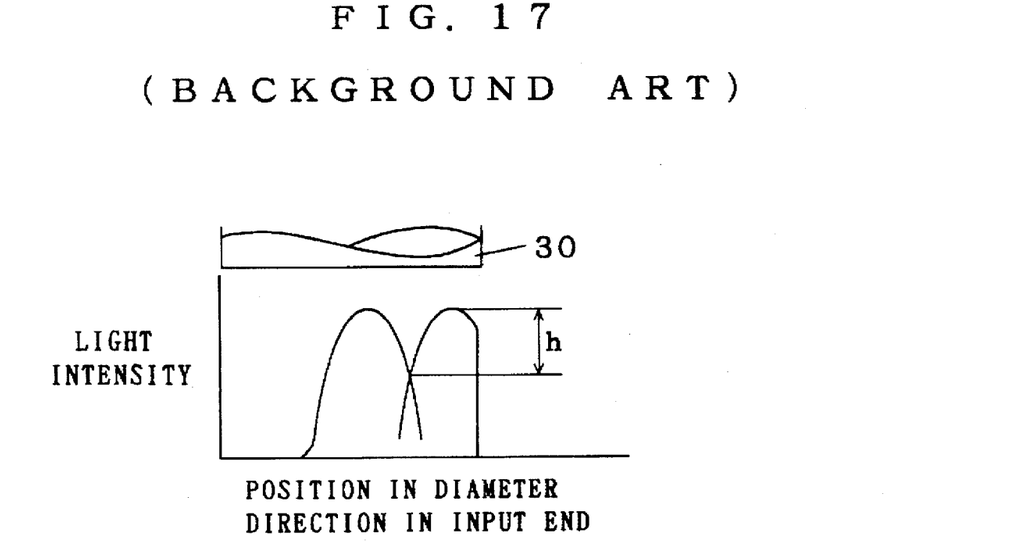
FIG. 17 is a diagram showing the light intensity distribution of the light signals incident upon the light guide of the conventional light trigger thyristor.

FIG. 17 shows the light intensity distribution of the light signals incident upon the light guide 7 in this condition. As shown in FIG. 17, part of the light signals does not strike the light guide 7 and the optical loss in the connection between the optical fibers and the light guide increases, producing the problem that the minimum power (PLT) for ignition of the thyristor element can not be obtained sufficiently. In order to prevent it, this from occuring is necessary to adjust the relative position of the optical fibers and the light guide very accurately, leading to the problem of time-consuming assembly.

SUMMARY OF THE INVENTION

According to a first aspect of the present invention, a light trigger thyristor comprises: a light guide comprising a light receiving portion receiving a light signal serving as a trigger of thyristor operation, a light entering end for the light signal and a light emitting end facing the light receiving portion, for transmitting the light signal to the light receiving portion; a plurality of first optical fibers for transmitting the light signal from a plurality of light signal generating sources provided outside to the light entering end of the light guide; and a lens disposed in front of the light entering end of the light guide for making the light signal emitted from the plurality of first optical fibers a parallel ray; wherein the light guide is an array type light guide having a plurality of second optical fibers grouped together.

Preferably, according to a second aspect of the present invention, in the light trigger thyristor, the light guide is so disposed that the light entering end coincides with an exit-side focal plane of the lens, and the plurality of first optical fibers are so disposed that their light emitting ends coincide with an incidence-side focal plane of the lens.

Preferably, according to a third aspect of the present invention, in the light trigger thyristor, the light guide is so disposed that the light entering end coincides with an exit-side focal plane of the lens, and the plurality of first optical fibers are so disposed that their light emitting ends are located closer to the lens than an incidence-side focal plane of the lens.

Preferably, according to a fourth aspect of the present invention, in the light trigger thyristor, the lens is a plano-convex lens comprising a convex surface on its one side and a flat surface on its other side, the lens being so disposed that the flat surface is located on the light guide side.

Preferably, according to a fifth aspect of the present invention, in the light trigger thyristor, the lens is a gradient index lens having a refractive index distribution in a diameter direction in which the refractive index is the highest in the center and decreases as it gets closer to the periphery and having flat surfaces on its both sides.

Preferably, according to a sixth aspect of the present invention, in the light trigger thyristor, the lens is a meniscus lens comprising convex surface on its one side and a concave surface on its other side, and the lens is so disposed that the concave surface is located on the light guide side.

Preferably, according to a seventh aspect of the present invention, the light trigger thyristor further comprises a sleeve into which the light guide and the lens are inserted, for optically coupling the light guide and the lens, wherein the sleeve includes a light guide engaging portion into which the light guide is inserted, a lens engaging portion into which the lens is inserted, and a gap provided to extend through between the light guide engaging portion and the lens engaging portion for separating the light guide and the lens for a certain distance, wherein the light guide engaging portion, the lens engaging portion and the gap are formed such that their respective center axes are all positioned on the same axis.

Preferably, according to an eighth aspect of the present invention, in the light trigger thyristor, the light guide engaging portion is a hole comprising a bottom with an inside diameter corresponding to an outside diameter of the light guide and the lens engaging portion is a hole comprising a bottom with an inside diameter corresponding to an outside diameter of the lens, wherein the light guide and the lens are adhered with an adhesive.

Preferably, according to a ninth aspect of the present invention, in the light trigger thyristor, the light guide engaging portion has a ring-like first groove along its inner side wall and a ring-like second groove along its bottom rim, and the lens engaging portion has a ring-like third groove along its inner side wall and a ring-like fourth groove along its bottom rim, wherein the first and third grooves are filled with the adhesive.

Preferably, according to a tenth aspect of the present invention, in the light trigger thyristor, the light guide engaging portion is a hole with a bottom having its inside diameter corresponding to an outside diameter of the light guide and the lens engaging portion is a hole with a bottom having its inside diameter corresponding to an outside diameter of the lens, wherein the light guide and the lens are fixed by uniformly applying pressure to the sleeve inwardly from the outside to inwardly compress the sleeve.

Preferably, according to an eleventh aspect of the present invention, in the light trigger thyristor, the sleeve has at least one through hole extending from its peripheral surface to reach the gap.

Preferably, according to a twelfth aspect of the present invention, in the light trigger thyristor, the sleeve has at least one first through hole extending from its peripheral surface to reach the light guide engaging portion and at least one second through hole extending to reach the lens engaging portion.

Preferably, according to a thirteenth aspect of the present invention, the light trigger thyristor further comprises a reflection preventing film on the light entering end of the light guide and both surfaces of the lens.

According to the light trigger thyristor of the first aspect of the present invention, the light guide for transmitting light signals to the light receiving portion is an array type light guide including a plurality of second optical fibers grouped together. It provides a solution to the phenomenon that the light leaks at a bending portion of the light guide and increases the transmission efficiency of the light signals. Even if the intensity distribution of light signals emitted from the plurality of first optical fibers is not uniform but has a plurality of peaks, the lens causes the light signals incident upon the light guide to become parallel rays and light signals with a uniform intensity distribution are applied to the light receiving portion. This prevents breakage of the thyristor due to concentration of light signals and enlarges the permissible range of misalignment of the optical axis of the optical transmission system, providing a light trigger thyristor enabling a reduction of optical loss without accurately adjusting the relative position of the first optical fibers and the light guide.

According to the light trigger thyristor of the second aspect of the present invention, disposing the light guide such that its light entering end coincides with the exit-side focal plane of the lens and disposing the plurality of first optical fibers such that the light emitting ends coincide with the incidence-side focal plane of the lens causes the light signals transmitted through the lens to become parallel rays.

According to the light trigger thyristor of the third aspect of the present invention, by disposing the light guide such that its light entering end coincides with the exit-side focal plane of the lens and disposing the plurality of first optical fibers such that the light emitting ends are located closer to the lens than the incidence-side focal plane of the lens, the light signals transmitted through the lens can be turned into parallel rays and the spread of the light signals emitted from the plurality of first optical fibers to reach the lens can be reduced, which allows even a lens having a small diameter to make the light signals uniform. Furthermore, it increases the permissible amount of decentering of the plurality of first optical fibers.

According to the light trigger thyristor of the fourth aspect of the present invention, a plano-convex lens is used and it is so disposed that its flat surface is on the light guide side. Accordingly, it can be positioned using the flat surface, facilitating adjustment of optical axis of the light guide and the plano-convex lens.

According to the light trigger thyristor Of the fifth aspect of the present invention, a gradient index lens having the refractive index distributed in the diameter direction and having flat surfaces on both sides is used. Accordingly, the positioning can be made with either of the surfaces because it has no directivity of entrance and exit for light signals, which facilitates optical axis adjustment of the light guide and the gradient index lens.

According to the light trigger thyristor of the sixth aspect of the present invention, a meniscus lens is used and it is so disposed that the concave surface is on the light guide side. Accordingly, even with the same focal length on the light entering side and the light emitting side, the refractive power is larger on the side of the plurality of first optical fibers. Accordingly, a lens with a smaller diameter can obtain the same functions as other lenses, e.g., a plano-convex lens. If a lens with the same diameter is used, the permissible amount of eccentricity of the plurality of first optical fibers can be increased as compared with the plano-convex lens.

According to the light trigger thyristor of the seventh aspect of the present invention, the light guide and the lens are optically coupled by inserting the light guide and the lens into a sleeve. Accordingly, preparing the light guide and the lens united into one with the sleeve in advance allows the entire device to be assembled in the same time required in the conventional assembly. Furthermore, the interval between the light guide and the lens can be set by the length of the gap between the light guide engaging portion and the lens engaging portion, which facilitates and ensures such arrangement that the light entering end of the light guide coincides with the exit-side focal plane of the lens.

According to the light trigger thyristor of the eighth aspect of the present invention, since the light guide engaging portion and the lens engaging portion have bottoms, the light guide and the lens can be easily positioned by inserting the light guide and the lens such that their respective ends reach the bottoms of the holes. Then the light guide and the lens are bonded with an adhesive so that the light guide and the lens can be certainly united with the sleeve.

According to the light trigger thyristor of the ninth aspect of the present invention, an adhesive is filled into the first and third grooves to adhere the light guide and the lens. Hence, it is sufficient to put the adhesive only in the first and third grooves, which eliminates the necessity of forming a gap for application of the adhesive on the sides of the light guide and the lens. This allows the dimensional tolerance of the inner diameters of the light guide engaging portion and the lens engaging portion to be reduced and allows the center axis of the light guide and the optical axis of the lens to coincide very accurately. When the light guide and the lens are inserted into the light guide engaging portion and the lens engaging portion and the adhesive put in the first and third grooves attaches to the end surfaces of the light guide and the lens, the adhesive is accommodated in the second and fourth grooves and prevented from penetrating to the surfaces relating to light transmission of the light guide and the lens.

According to the light trigger thyristor of the tenth aspect of the present invention, the light guide engaging portion and the lens engaging portion have bottoms. Accordingly, the light guide and the lens can be positioned easily by inserting the light guide and the lens so that their respective ends reach the bottoms of the holes. The light guide and the lens are then fixed by uniformly applying pressures from the outside of the sleeve toward the inside to inwardly compress the sleeve, which allows the light guide and the lens to be easily united with the sleeve in a short time, providing a light trigger thyristor having excellent adaptability to mass production.

According to the light trigger thyristor of the eleventh aspect of the present invention, the through hole extending from the external surface of the sleeve to reach the gap prevents air from staying in the gap to push back the light guide and the lens when the light guide and the lens are inserted.

According to the light trigger thyristor of the twelfth aspect of the present invention, the first through hole extending from the peripheral surface of the sleeve to reach the light guide engaging portion and the second through hole extending to reach the lens engaging portion let air contained in the adhesive go out and allows confirmation of the condition of adhesion when adhering the light guide and the lens with an adhesive.

According to the light trigger thyristor of the thirteenth aspect of the present invention, it has reflection preventing films on the light entering end of the light guide and the both sides of the lens, which prevents reflection to reduce transmission loss.

The present invention has been made to solve the problems described before, and it is an object of the present invention to provide a light trigger thyristor which offers a solution to the phenomenon that the light leaks out at a bending portion of a light guide to increase the transmission efficiency for light signals, prevents breakdown of the thyristor element due to concentration of light signals even when light signals enter from a plurality of light sources, and which decreases optical loss due to misalignment of the optical axis of the optical transmission system without very accurately adjusting the relative position of the optical fibers and the light guide.

These and other objects, features, aspects and advantages of the present invention will become more apparent from the following detailed description of the present invention when taken in conjunction with the accompanying drawings.

DESCRIPTION OF THE PREFERRED EMBODIMENTS

<A. First Preferred Embodiment>

<A-1. Entire Device Structure>

Figure 1:
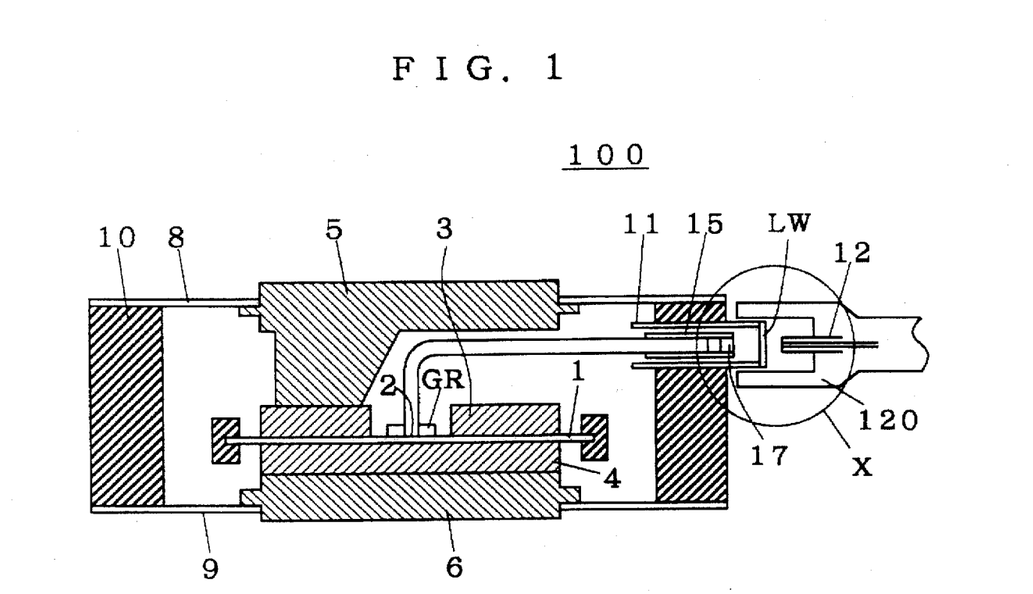
FIG. 1 is a sectional view illustrating the entire structure of a first preferred embodiment of a light trigger thyristor according to the present invention.
Figure 2:
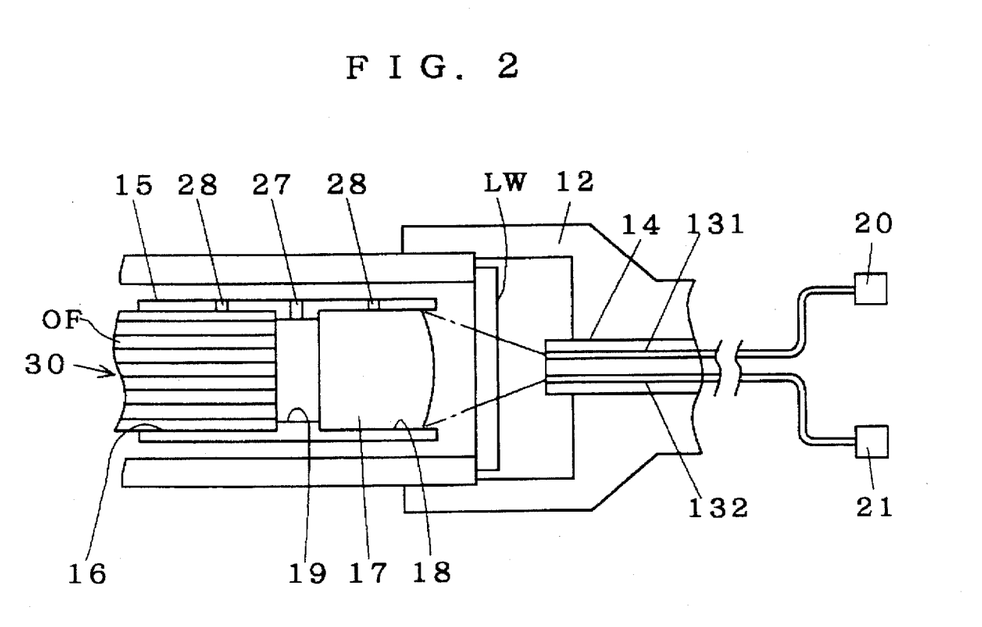
FIG. 2 is a sectional view illustrating the structure of a part of the first preferred embodiment of the light trigger thyristor according to the present invention.

As a first preferred embodiment of a light trigger thyristor according to the present invention, FIG. 1 shows a sectional view of a light trigger thyristor 100 and FIG. 2 shows the details of its optical coupling portion.

In FIG. 1, a semiconductor body 1 mainly composed of a semiconductor substrate having a built-in thyristor has a light receiving portion 2 provided in the center of its upper main surface. A light emitting end of a light guide 30 for transmitting light signals provided from the outside faces this light receiving portion 2. The light emitting end of the light guide 30 is positioned to the light receiving portion 2 by a guide ring GR.

A first thermal compensator 3 and a second thermal compensator 4 formed of materials having a coefficient of thermal expansion which is approximate to that of the semiconductor body 1 abut on the upper main surface and the lower main surface of the semiconductor body 1. These first and second thermal compensators 3 and 4 are pressure-connected on both main surfaces of the semiconductor body 1 in a so-called alloy-free manner without bonded to the semiconductor substrate 1 by soldering or the like.

The first and second thermal compensators 3 and 4 are pressed and held by a cathode plate 5 and a anode plate 6, respectively. The cathode plate 5 and the anode plate 6 have their respective bases coupled to a casing 10 formed of an electrically insulating material through the circular cathode flange 8 and anode flange 9.

The casing 10 has a hollow cylinder inside to accommodate the semiconductor body 1, the first and second thermal compensators 3 and 4, and the cathode plate 5 and the anode plate 6.

A through hole is formed in the side surface of the casing 10, into which a receiving metal fitting 11 is fixedly inserted. A light transmitting light introducing window LW through which light signals from the outside pass is airtightly fixed to the receiving metal fitting 11. The light guide 30 is held in the receiving metal fitting 11 with its light entering end side inserted in one end of a cylindrical sleeve 15. A plano-convex lens 17 is inserted into the other end of the cylindrical sleeve 15 to face the light introducing window LW. In this structure, a connector terminal 12 to which step index optical fibers 131 and 132 (first optical fibers) are coupled is attached to the receiving metal fitting 11. The casing 10 is kept airtight inside with an inert gas sealed therein to prevent characteristic deterioration of the thyristor element.

<A-2. Structure of Light Guide>

FIG. 2 is a diagram showing the details of the region X (the optical coupling portion) shown in FIG. 1. As shown in FIG. 2, in the connector terminal 12, the step index optical fibers 131 and 132 are held in the ferrule 14 and the ferrule 14 is coupled to the connector terminal 12. The optical fibers 131 and 132 are respectively connected to the laser diode (LD) modules 20 and 21 which generate light signals. The light guide 30 is composed of a plurality of step index optical fibers OF (second optical fibers) grouped together.

The step index optical fibers are used for the optical fibers 131 and 132 and the optical fibers OF because they have smaller angle dependency of emitted light on incident light as compared with the graded index optical fibers, so that the emitted light has a relatively uniform light intensity distribution even if the incident light has an angle.

The reason why the light guide 30 is formed by grouping the plurality of optical fibers OF together will now be described.

Figure 3:
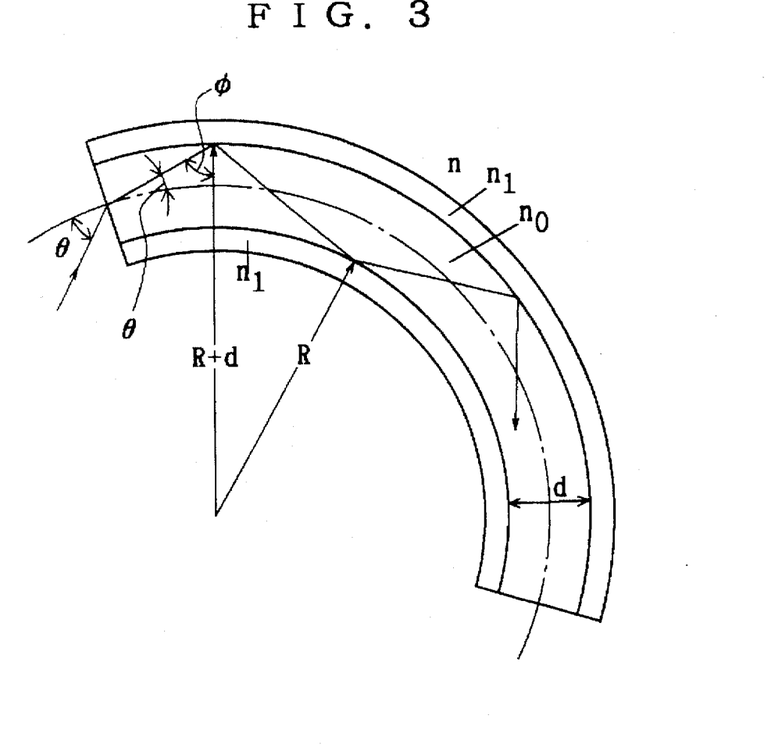
FIG. 3 is a schematic diagram illustrating the transmission of light in a bent optical fiber.

FIG. 3 shows a geometrical analysis diagram in a bending portion of an optical fiber. In FIG. 3, if the core diameter is taken as d, the curvature of the inside of the core portion is taken as R, the angle of incidence of the light signal is taken as θ, the critical angle is taken as φ, the refractive index of the core portion is taken as $n_0$, the refractive index of the clad portion is taken as $n_1$, and the external refractive index is taken as n, then the numerical aperture (N.A) is determined on the basis of the difference in refractive index between the core portion and the clad portion of the optical fiber, which is given by the expression (1):

$$n\sin\theta = \sqrt{n_0^2 - n_1^2} = N \cdot A \quad (1)$$

The critical angle when the optical fiber is bent is given by the expression (2):

$$\sin\phi = \frac{\cos\theta[R + (d/2) + h]}{R + d} \quad (2)$$

The "h" in the expression (2) is a height of the starting point of the incident light from the optical axis of the optical fiber.

The condition under which all lights are transmitted through the core portion having the numerical aperture determined by the expression (1) is given by the expression (3).

$$\sin\phi \leq \frac{\cos\theta[R + (d/2) + h]}{R + d} \quad (3)$$

Accordingly, it is seen that, if the critical angle φ, the numerical aperture of the light guide, and the curvature R of the inside of the core portion of the light guide are constant, the transmission efficiency increases as the core diameter is made smaller. Hence, the light guide 30 is formed by grouping together a plurality of optical fibers OF each having a core diameter smaller than that of the light guide 7 formed of a single optical fiber.

Figure 4:
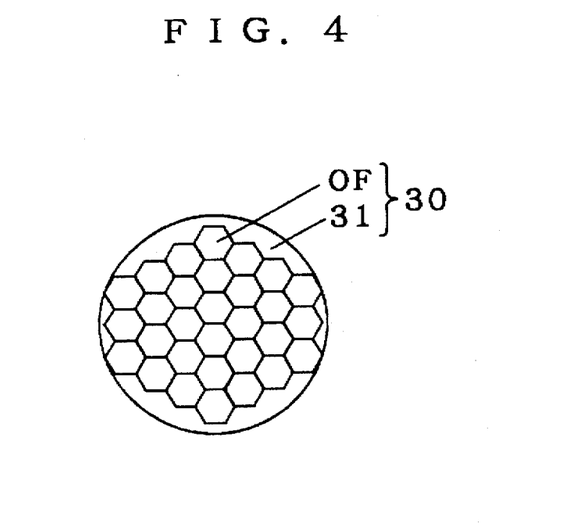
FIG. 4 is a diagram illustrating the sectional structure of the light guide of the light trigger thyristor according to the present invention.

FIG. 4 schematically shows the structure of the end of the light guide 30. In FIG. 4, a plurality of optical fibers OF each having a hexagonal section are bundled and united in the glass pipe 31. The light guide having such structure is called an array-type light guide. The sectional form of the optical fiber OF is made hexagonal for the purpose of increasing the charging efficiency and minimizing the area which does not contribute to the optical transmission. As an example, with an optical fiber having a diameter of 50 μm and a glass pipe having a diameter of 2 mm, about a thousand optical fibers can be grouped together. Although the optical fiber OF has a single core portion and a clad portion surrounding it, these are not shown in FIG. 4.

The use of the light guide 30 having such structure provides a solution to the phenomenon that the light leaks out at the bending portion of the light guide and improves the transmission efficiency of light signals.

<A-3. Structure of Cylindrical Sleeve>

As shown in FIG. 2, the light entering end side of the light guide 30 is inserted into one end of the cylindrical sleeve 15 and a plano-convex lens 17 is inserted into the other end with a flat surface side of the lens 17 located inside the sleeve 15 and facing the libht guide 30.

The light guide 30 is inserted only halfway in the cylindrical sleeve 15 because a light guide engaging portion 16 having its inside diameter corresponding to the outside diameter of the light guide 30 is provided only for a certain length in the axial direction.

The lens engaging portion 18 having its inside diameter corresponding to the outside diameter of the plano-convex lens 17 is also provided only for a certain length in the axial direction and therefore the plano-convex lens 17 is also inserted only halfway in the cylindrical sleeve 15. The space between the light entering end of the light guide 30 and the flat surface of the plano-convex lens 17 forms a gap 19 for providing a predetermined focal length.

Now, the length in the axial direction of the lens engaging portion 18 is set so that the light entering side of the plano-convex lens 17 is completely concealed in the cylindrical sleeve 15 when the plano-convex lens 17 is inserted in the lens engaging portion 18. In this way the light entering side of the plano-convex lens 17 is prevented from being damaged by contact with other structural elements, like the receiving metal fitting 11, during assembly.

The cylindrical sleeve 15 is formed such that the center axes of the light guide engaging portion 16, the lens engaging portion 18 and the gap 19 are all positioned on the same axis. The cylindrical sleeve 15, and the light guide 30 and the plano-convex lens 17 are fixed with an adhesive (not shown) such as an epoxy system.

A through hole 29 for letting the air out is provided in the gap 19 of the cylindrical sleeve 15 to prevent air from filling the gap 19 when the light guide 30 and the plano-convex lens 17 are inserted and pushing back the light guide 30 and the plano-convex lens 17. The light guide engaging portion 16 and the lens engaging portion 18 also have through holes 28 for letting the air in the adhesive go out and for confirmation of the adhesion state.

In this way, since the plano-convex lens 17 and the light guide 30 are integrated with the cylindrical sleeve 15, preparing in advance the plano-convex lens 17 and the light guide 30 combined into one with the cylindrical sleeve 15 allows assembly of the entire device to be accomplished in the same time as required in the conventional assembly.

<A-4. Functions and Effects of Plano-convex Lens>

Figure 5:
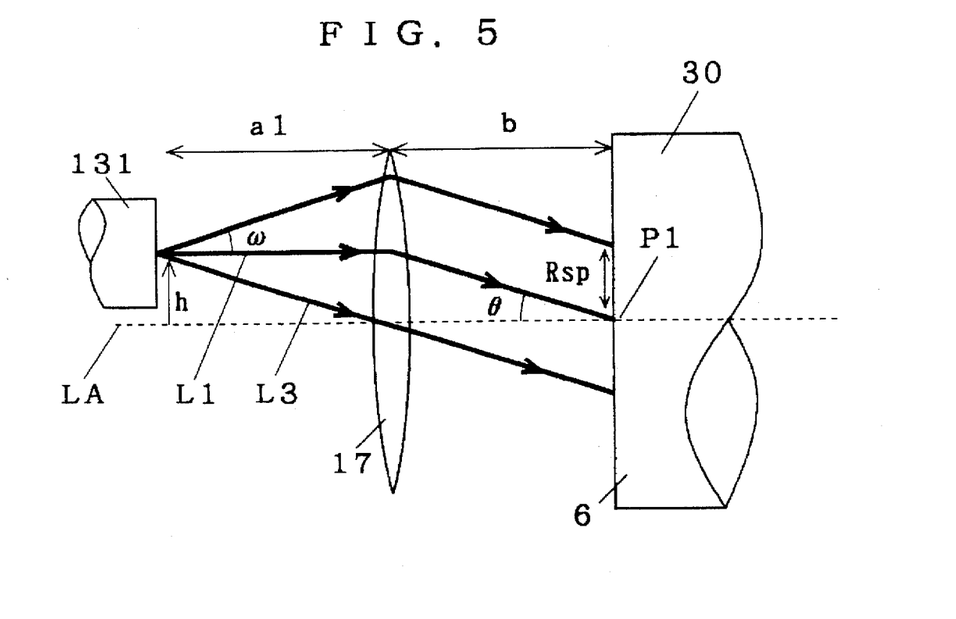
FIG. 5 is a diagram schematically showing arrangement of the optical elements and paths of light signal in the first preferred embodiment of the light trigger thyristor according to the present invention.

Next, the functions and effects of the plano-convex lens will be described referring to FIG. 5 to FIG. 8. FIG. 5 schematically shows the arrangement of the optical fiber 131, the plano-convex lens 17 and the light guide 30, where the plano-convex lens 17 is shown as a convex lens for simplification.

In FIG. 5, the optical fiber 131 is disposed such that its light emitting end is located on the incidence-side focal plane of the plano-convex lens 17, and the light guide 30 is disposed such that its light entering end is located on the exit-side focal plane of the plano-convex lens 17. The interval between the optical fiber 131 and the plano-convex lens 17 is a1 and the interval between the plano-convex lens 17 and the light guide 30 is b.

FIG. 5 schematically shows the path of the light coming from the optical fiber 131 and entering the light guide 30.

As has been described above, the interval a1 between the optical fiber 131 and the plano-convex lens 17 is equal to the focal length of the plano-convex lens 17 and the interval b between the plano-convex lens 17 and the light guide 30 is equal to the focal length of the plano-convex lens 17. Hence, as shown in FIG. 5, the optical path of the principal ray L1 emitted from the light emitting end of the optical fiber 131 in parallel to the optical axis of the plano-convex lens 17 is bent at the plano-convex lens 17 and then passes to the position P1 where the optical axis LA of the plano-convex lens 17 intersects the light entering end of the light guide 30 to enter the light guide 30.

The optical paths of the divergent rays L2 and L3 sent out from the light emitting end of the optical fiber 131 at a certain angle with respect to the optical axis of the plano-convex lens 17 are bent at the plano-convex lens 17 and then strike the light guide 30 almost in parallel with the principal ray L1. Thus, the light signal emitted from the optical fiber 131 is converted to a parallel ray by the plano-convex lens 17 and then enters the light guide 30.

Now, The radius Rsp of the luminous flux incident upon the light guide 30 and the angle of incidence θ are represented as shown below using the focal length f of the plano-convex lens 17, the spread angle ω of the light signal from the optical fiber 131 and the height h of the emitting point of the optical fiber 131 from the optical axis LA.

$$Rsp = f \times \omega \quad (4)$$

$$\theta = h/f \quad (5)$$

From the expression (4), the light signal sent out from the optical fiber 131 enters the light guide 30 in the distribution with the radius Rsp around the position P1 where the optical axis LA of the plano-convex lens 17 intersects the light entering end of the light guide 30 independently of the position of the light emitting point of the optical fiber 131.

Figure 6:
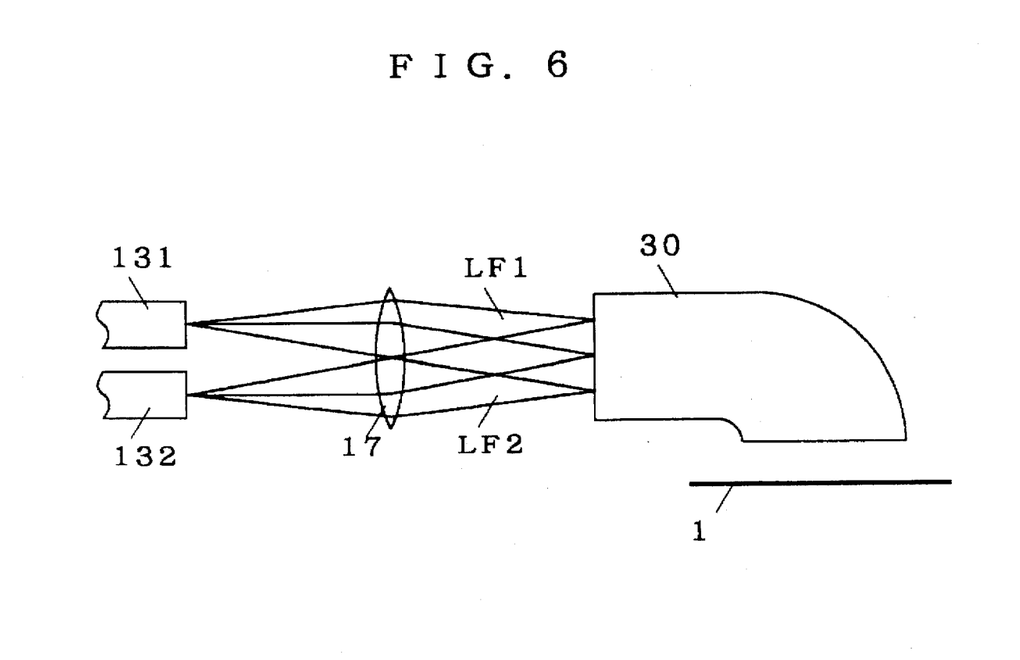
FIG. 6 is a diagram schematically showing the light signals becoming parallel rays in the first preferred embodiment of the light trigger thyristor according to the present invention.

The same is true for the light signal emitted from the optical fiber 132, and FIG. 6 schematically shows how the light signals sent out from the optical fibers 131 and 132 are made to become parallel rays by the plano-convex lens 17.

As shown in FIG. 6, the light signals coming from the optical fibers 131 and 132 impinge upon the light guide 30 as the parallel rays LF1 and LF2. Since the parallel rays LF1 and LF2 are radiated to overlap each other, the light intensity distribution is uniform on the light entering end of the light guide 30 even if the light signals emitted from the optical fibers 131 and 132 have the light intensity distribution having individual peaks, as has been previously explained with reference to FIG. 15.

Figure 7:
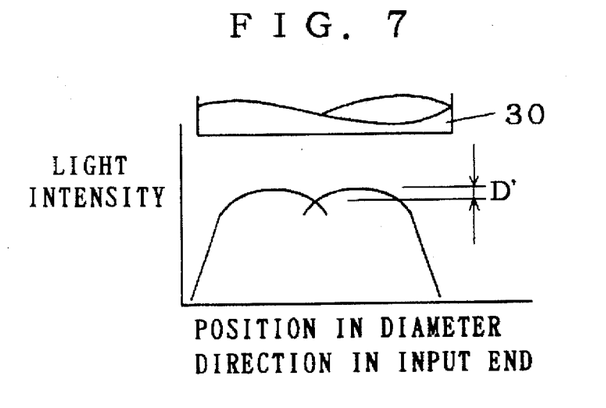
FIG. 7 is a diagram showing the light intensity distribution of light signals incident upon the light guide in the first preferred embodiment of the light trigger thyristor according to the present invention.

FIG. 7 shows the light intensity distribution of light signals incident upon the light guide 30. In FIG. 7, the horizontal axis shows the position of the light entering end of the light guide 30 in the diameter direction and the vertical axis shows the light intensity.

As shown in FIG. 7, the peaks of the light signals incident upon the light guide 30 are leveled and the light intensity is almost equal in the center and in the peripheral part of the light guide 30. Accordingly, if the difference between the light intensity at the portion where the two peaks intersect and the light intensity at the top of the peak is taken as the intensity difference D', it is clearly seen that it is smaller than the intensity difference D in the light intensity distribution in the light trigger thyristor 99 explained using FIG. 15.

Accordingly, the light signals radiated to the light receiving portion 2 of the semiconductor body 1 through the light guide 30 are also uniform, which prevents the light receiving portion 2 from being broken by local concentration of the main current due to uneven light signals in the light receiving portion 2. This makes the maximum power density small and sufficiently provides the minimum power (PLT), meaning the improvement of the trade-off relation between the maximum power density and the minimum power (PLT).

As shown in FIG. 6, the light signals sent out from the optical fibers 131 and 132 become parallel rays and are radiated, while overlapping, into the same area of the light guide 30. Therefore even if the installation position of the optical fibers 131 and 132 in the height direction changes, that is, even if the optical fibers are somewhat decentered, the intensity distribution of the incident lights onto the light guide 30 is not changed. In other words, it can be said that the permissible amount of decentering of the optical fibers is increased, or that the permissible range of the misalignment of the optical axis of the optical transmission system is widened.

Furthermore, since the parallel rays LF1 and LF2 are radiated onto the light guide 30, a change in intensity of the light signals radiated to the light guide 30 is small even if the interval between the plano-convex lens 17 and the light guide 30 somewhat changes.

Thus, the loss of light signals due to misalignment of the optical axis of the optical transmission system can be reduced without very accurately adjusting the relative position of the optical fibers 131 and 132 and the light guide 30.

<A-5. Functions and Effects of Reflection Preventing Film>

The light trigger thyristor 100 explained above, which additionally includes a lens system such as the plano-convex lens 17, has another facet that the transmission loss due to reflection on the lens surface is increased.

The transmission loss can be reduced by preventing reflection by forming a reflection preventing film composed of $SiO_2$, $Ta_2O_5$, or the like, on the light entering end of the light guide 30 and the both surfaces of plano-convex lens 17.

Now, the relation shown by the expression (6) holds between the film thickness M of the reflection preventing film and the wavelength λ of the incident light $$M = \frac{\lambda(2n-1)}{4 \times n_0} \quad (n=1,2,3,4\ldots) \tag{6}$$

In the expression (6), $n_0$ is a refractive index of the reflection preventing film, and it is seen that setting the film thickness of the reflection preventing film to an odd multiple of the wavelength λ of the incident light enables prevention of reflection.

<A-6. First Modification>

Although an example in which the interval between the optical fiber 131 and the plano-convex lens 17 is equal to the focal length of the plano-convex lens 17 was shown in the light trigger thyristor 100 explained above, this distance may be changed.

Figure 8:
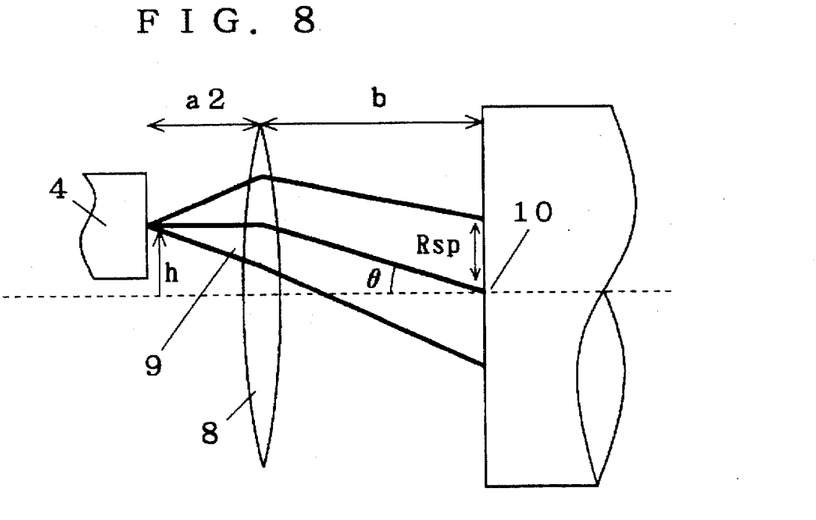
FIG. 8 is a diagram schematically showing the arrangement of the optical elements and paths of light signal in a modification of the first preferred embodiment of the light trigger thyristor according to the present invention.

That is to say, as shown in FIG. 8, the optical fiber 131 may be disposed closer to the plano-convex lens 17 than the focal plane on the incidence side of the plano-convex lens 17, with the interval between the optical fiber 131 and the plano-convex lens 17 set to a2.

The light guide 30 is so disposed that its light entering end is located on the exit-side focal plane of the plano-convex lens 17. The interval between the optical fiber 131 and the plano-convex lens 17 is a2 and the interval between the plano-convex lens 17 and the light guide 30 is b.

This arrangement reduces the spread of the light signals coming from the optical fibers 131 and 132 to reach the plano-convex lens 17 and the light signals can be made uniform even with a lens having a smaller diameter. The permissible amount of decentering of the optical fiber is also increased.

<A-7. Second Modification>

The plano-convex lens 17 is used to make the light signals incident upon the light guide 30 uniform in the light trigger thyristor 100 explained above because its flat surface facilitates positioning in the cylindrical sleeve 15. Needless to say, however, a mere convex lens can be used instead of the plano-convex lens 17.

<A-8. Third Modification>

Figure 9:
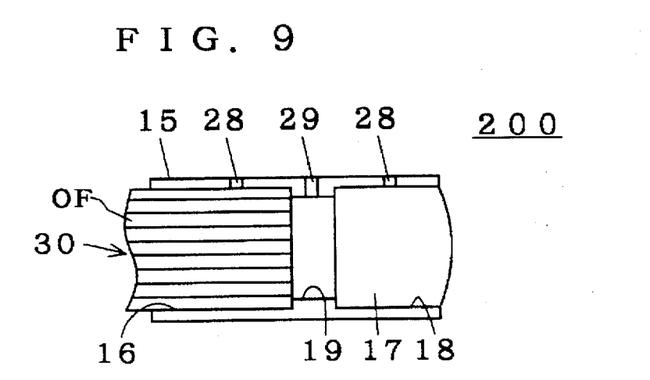
FIG. 9 is a sectional view illustrating a modification of the first preferred embodiment of the light trigger thyristor according to the present invention.

In the light trigger thyristor 100 explained above, the length in the axial direction of the lens engaging portion 18 is set so that the light entering surface of the plano-convex lens 17 is completely concealed in the cylindrical sleeve 15 when the plano-convex lens 17 is inserted therein. As shown in FIG. 9, however, the light entering surface of the plano-convex lens 17 may protrude from the cylindrical sleeve 151.

In FIG. 9, the length in the axial direction of the lens engaging portion 181 of the cylindrical sleeve 151 is set so that the light entering surface of the plano-convex lens 17 protrudes from the end of the cylindrical sleeve 151 when the plano-convex lens 17 is inserted.

This structure solves the problem that the light signal incident upon the plano-convex lens 17 is intercepted by the cylindrical sleeve 151.

The embodiment of FIG. 9 includes the same components as those shown in FIG. 2 and an overlapping description is not made here for the sake of brevity.

<B. Second Preferred Embodiment>

Figure 10:
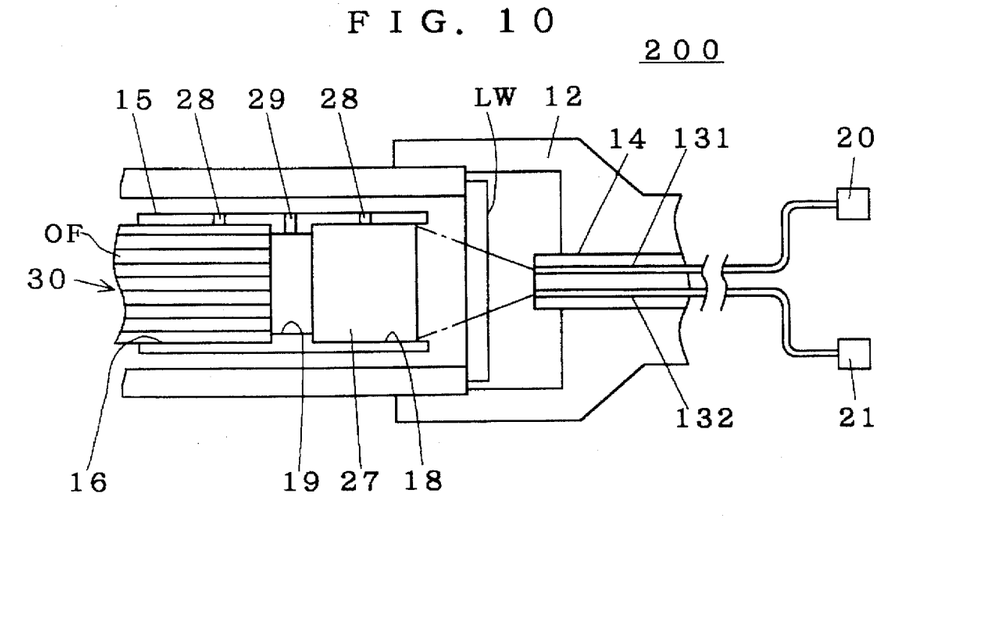
FIG. 10 is a sectional view illustrating the structure of a part of a second preferred embodiment of the light trigger thyristor according to the present invention.

FIG. 10 show as a second preferred embodiment of the light trigger thyristor according to the present invention, including details of the optical coupling portion of a light trigger thyristor 200.

<B-1. Structure of Cylindrical Sleeve>

As shown in FIG. 10, the light entering end side of the light guide 30 is inserted into one end of the cylindrical sleeve 15 and a gradient index lens 27 is inserted into the other end.

The structure is different from that of the light trigger thyristor 100 explained referring to FIG. 1 and FIG. 2 only in that the plano-convex lens 17 is replaced by the gradient index lens 27 with the remaining structural elements being the same and therefore not described again.

<B-2. Functions and Effects of Gradient Index Lens>

Next, functions and effects of the gradient index lens 27 will be described. The gradient index lens 27 has a cylinder-shaped appearance and its refractive index is distributed in the diameter direction. In the distribution, the refractive index is the highest in the center and becomes lower as it approaches the periphery.

When light enters one surface (light entering surface) of the gradient index lens 27, it propagates in an optical path like a sine wave and is sent out from the other surface (light emitting surface). This function is the same as that of the plano-convex lens 17. When the interval between the optical fibers 131 and 132 and the gradient index lens 27 is set equal to the focal length of the gradient index lens 27 and the interval between the gradient index lens 27 and the light guide 30 is set equal to the focal length of the gradient index lens 27, then the optical path of the divergent rays emitted from the light emitting ends of the optical fibers 131 and 132 at a certain angle with respect to the optical axis of the gradient index lens 27 is bent at the gradient index lens 27 and they enter the light guide 30 in the form of parallel rays.

Accordingly, even if the light signals given off from the optical fibers 131 and 132 have light intensity distribution having individual peaks, the light intensity distribution on the light entering end of the light guide 30 is uniform.

Furthermore, since the gradient index lens 27 is like a cylinder in external form and has no directivity about an entrance surface and an exit surface for light signals, it is easy to insert it into the cylindrical sleeve 15. When it is inserted into the lens engaging portion 18 of the cylindrical sleeve 15, it is easy to position it in the cylindrical sleeve 15.

Moreover, in the gradient index lens, its optical axis and its cylindrical peripheral surface are generally kept precisely coaxial, and therefore forming the light guide engaging portion 16, the lens engaging portion 18 and the gap 19 of the cylindrical sleeve 15 so that their centers are all located on the same axis certainly allows the optical axis of the gradient index lens 27 and the center axis of the light guide 30 to coincide, increasing the accuracy in assembly.

<C. Third Preferred Embodiment>

Figure 11:
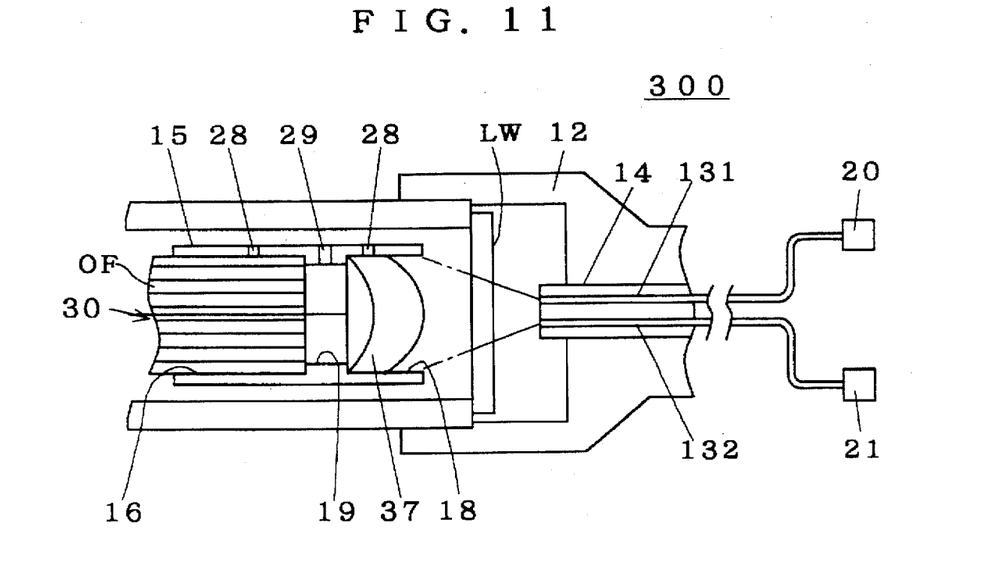
FIG. 11 is a sectional view illustrating structure of a part of a third preferred embodiment of the light trigger thyristor according to the present invention.

FIG. 11 shows a third preferred embodiment of the light trigger thyristor according to the present invention, including details of the optical coupling portion of a light trigger thyristor 300.

<C-1. Structure of Cylindrical Sleeve>

As shown in FIG. 11, the light entering end side of the light guide 30 is inserted into one end of the cylindrical sleeve 152 and a meniscus lens 37 having a concave light emitting surface and a convex light entering surface is inserted into the other end.

The structure differs from that of the light trigger thyristor 100 explained using FIG. 1 and FIG. 2 only in that the plano-convex lens 17 is replaced by the meniscus lens 37 with the remaining structural elements being the same and therefore not described again.

<C-2. Functions and Effects of Meniscus Lens>

Next, functions and effects of the meniscus lens 37 will be described. When the interval between the optical fibers 131 and 132 and the meniscus lens 37 is set equal to the focal length of the meniscus lens 37 and the interval between the meniscus lens 37 and the light guide 30 is set equal to the focal length of the meniscus lens 37, then the optical path of the divergent rays emitted from the light emitting ends of the optical fibers 131 and 132 at a certain angle with respect to the optical axis of the meniscus lens 37 is bent at the meniscus lens 27 and then they strike the light guide 30 in the form of parallel rays.

Accordingly, even if the light signals sent out from the optical fibers 131 and 132 have light intensity distribution having individual peaks, the light intensity distribution on the light entering end of the light guide 30 is uniform.

Since the meniscus lens 37 has a negative refractive power on the light guide 30 side, the refractive power on the side of the optical fibers 131 and 132 is larger even if the focal length is the same on the light entering side and the light emitting side. That is to say, the light signal largely bends at the light entering surface of the meniscus lens 37, so that a lens with a smaller diameter is sufficient to obtain the same effect as the piano-convex lens 17 explained in the first preferred embodiment. This means that the permissible amount of decentering of the optical fibers can be increased as compared with the plano-convex lens 17 when a lens having the same diameter is used.

<D. Fourth Preferred Embodiment>

As has been described referring to FIG. 2, in the first preferred embodiment of the present invention, the light entering end side of the light guide 30 is inserted into one end of the cylindrical sleeve 15 and the plano-convex lens 17 is inserted into its other end with its flat surface located inside. Here, while the gradient index lens 27 explained in the second preferred embodiment or the meniscus lens 37 explained in the third preferred embodiment may be used in place of the plano-convex lens 17, it is necessary to make the center axis of the light guide 30 and the optical axis of the lens coincide to reduce loss of the light signals.

For this purpose, it is desirable to make the dimensional tolerance of the light guide engaging portion 16 and the lens engaging portion 18 as small as possible. However, the cylindrical sleeve 15 shown in FIG. 2 needs a gap for application of the adhesive, which requires a larger dimensional tolerance. Hence, structure of a cylindrical sleeve which allows the gap for application of adhesive to be small will now be described.

Figure 12:
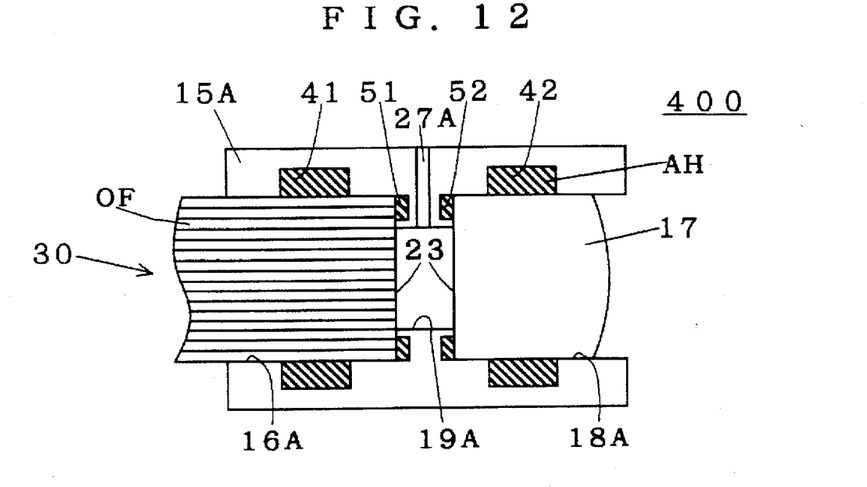
FIG. 12 is a sectional view illustrating structure of part of a fourth preferred embodiment of the light trigger thyristor according to the present invention.

FIG. 12 show as a fourth preferred embodiment of the light trigger thyristor according to the present invention, including the structure of a cylindrical sleeve 15A of a light trigger thyristor 400.

In FIG. 12, the light entering end side of the light guide 30 is inserted into the light guide engaging portion 16A of the cylindrical sleeve 15A and the plano-convex lens 17 is inserted into the lens engaging portion 18A.

Ring-like grooves 41 and 42 are formed along the inner side wall of the light guide engaging portion 16A and the lens engaging portion 18A and ring-like grooves 51 and 52 are formed along the bottom rim portions of the light guide engaging portion 16A and the lens engaging portion 18A.

The interval between the light entering end of the light guide 30 and the flat plane of the plano-convex lens 17 forms a gap 19A for holding a certain focal length. The gap 19A has a through hole 29A for letting the air out.

Now, the dimensional tolerance of the inside diameters of the light guide engaging portion 16A and the lens engaging portion 18A can be the minimum dimensional tolerance for engaging the light guide 30 and the plano-convex lens 17, respectively, because of the reason shown below. Therefore inserting the light guide 30 and the plano-convex lens 17 allows the center axis of the light guide 30 and the optical axis of the plano-convex lens 17 to very accurately coincide.

Here, the light guide 30 and the plano-convex lens 17 are affixed by filling the grooves 41 and 42 with an epoxy-system adhesive AH before inserting the light guide 30 and the plano-convex lens 17. Therefore, it is sufficient that the adhesive AH exists only in the grooves 41 and 42, which eliminates the need of forming a gap for application of the adhesive AH on the side surfaces of the light guide 30 and the plano-convex lens 17. Then the dimensional tolerance of the inside diameters of the light guide engaging portion 16A and the lens engaging portion 18A can be made smaller.

When the light guide 30 and the plano-convex lens 17 are inserted into the light guide engaging portion 16A and the lens engaging portion 18A, the adhesive AH filling the grooves 41 and 42 may attach to the ends of the light guide 30 and the plano-convex lens 17 to reach the bottom rim portions of the light guide engaging portion 16A and the lens engaging portion 18A. In this case, that adhesive AH is accommodated in the grooves 51 and 52, which prevents the adhesive AH from penetrating to the planes relating to light transmission of the light guide 30 and the plano-convex lens 17.

<E. Fifth Preferred Embodiment>

Although the first and fourth preferred embodiments of the present invention explained above have shown examples in which the light guide 30 and the plano-convex lens 17 are bonded to the cylindrical sleeve 15 or 15A with an epoxisies adhesive AH, the light guide 30 and the plano-convex lens 17 may be fixed by uniformly applying pressure to the cylindrical sleeve 15 inwardly from its periphery to inwardly compress the cylindrical sleeve 15 with the light guide 30 and the plano-convex lens 17 inserted in the cylindrical sleeve 15.

This allows the light guide 30 and the plano-convex lens 17 to be easily united with the cylindrical sleeve 15 in a short time, providing light trigger thyristors having excellent adaptability to mass production.

<F. Sixth Preferred Embodiment>

The above first through fifth preferred embodiments according to the present invention have shown the structure in which a lens for making uniform the light signals emitted from the optical fibers 131 and 132 (FIG. 1) (hereinafter merely referred to as a lens) is united with the light guide 30 using the cylindrical sleeve 15 (FIG. 1, FIG. 10, FIG. 11) or 15A (FIG. 12) and held in the receiving metal fitting 11, i.e., the structure in which the lens is provided in a sealed light trigger thyristor. Such structure has the advantage of preventing damage to the lens when the light trigger thyristor device is moved or in use, but the lens may be attached in front of the optical fibers 131 and 132 of the connector terminal 12.

In this case, unlike the first through fifth preferred embodiments, the optical fibers 131 and 132 and the lens are combined and the optical axes of the lens and the light guide 30 are misaligned, but the problem of misalignment is solved because the light signals sent out from the optical fibers 131 and 132 are made uniform by the lens. This, which is equivalent to the first through fifth preferred embodiments in the sense that the light signals are made uniform, also provides solutions to the problems of the conventional devices.

Furthermore, since the optical fibers 131 and 132 are integrally united with the lens, the lens, advantageously, can be easily changed depending on the kind of the optical fibers when the optical fibers are changed for those of a different kind.

While the invention has been described in detail, the foregoing description is in all aspects illustrative and not restrictive. It is understood that numerous other modifications and variations can be devised without departing from the scope of the invention.

We claim:

1. A light trigger thyristor, comprising:
   a light guide comprising a light receiving portion receiving a light signal serving as a trigger of thyristor operation, a light entering end for said light signal and a light emitting end facing said light receiving portion, for transmitting said light signal to said light receiving portion;
   a plurality of first optical fibers for transmitting said light signal from a plurality of light signal generating sources provided outside to said light entering end of said light guide; and
   a lens disposed in front of said light entering end of said light guide for making said light signal sent Out from said plurality of first optical fibers a parallel ray;
   wherein said light guide is an array type light guide having a plurality of second optical fibers grouped together.

2. The light trigger thyristor according to claim 1, wherein said light guide is so disposed that said light entering end coincides with an exit-side focal plane of said lens, and
   said plurality of first optical fibers are so disposed that their light emitting ends coincide with an incidence-side focal plane of said lens.

3. The light trigger thyristor according to claim 2, wherein said lens is a plano-convex lens comprising a convex surface on its one side and a flat surface on its other side,
   said lens being so disposed that said flat surface is located on said light guide side.

4. The light trigger thyristor according to claim 2, wherein said lens is a gradient index lens having a refractive index distribution in a diameter direction in which the refractive index is the highest in the center and decreases as it gets closer to the periphery and having flat surfaces on its both sides.

5. The light trigger thyristor according to claim 2, wherein said lens is a meniscus lens comprising a convex surface on its one side and a concave surface on its other side, and
   said lens is so disposed that said concave surface is located on said light guide side.

6. The light trigger thyristor according to claim 1, wherein said light guide is so disposed that said light entering end coincides with an exit-side focal plane of said lens, and
   said plurality of first optical fibers are so disposed that their light emitting ends are located closer to said lens than an incidence-side focal plane of said lens.

7. The light trigger thyristor according to claim 6, wherein said lens is a plano-convex lens comprising a convex surface on its one side and a flat surface on its other side, and
   said lens is so disposed that said flat surface is located on said light guide side.

8. The light trigger thyristor according to claim 6, wherein said lens is a gradient index lens having such a refractive index distribution in the diameter direction that the refractive index is the highest in the center and decreases as it gets closer to the periphery and comprising flat surfaces on its both sides.

9. The light trigger thyristor according to claim 6, wherein said lens is a meniscus lens comprising a convex surface on its one side and a concave surface on the other side, and
   said lens is so disposed that said concave surface is located on said light guide side.

10. The light trigger thyristor according to claim 1, further comprising,
    a sleeve into which said light guide and said lens are inserted, for optically coupling said light guide and said lens,
    wherein said sleeve includes,
    a light guide engaging portion into which said light guide is inserted,
    a lens engaging portion into which said lens is inserted, and
    a gap provided to extend through between said light guide engaging portion and said lens engaging portion for separating said light guide and said lens for a certain distance,
    wherein said light guide engaging portion, said lens engaging portion and said gap are formed such that their respective center axes are all positioned on the same axis.

11. The light trigger thyristor according to claim 10, wherein said light guide engaging portion is a hole comprising a bottom with an inside diameter corresponding to an outside diameter of said light guide, and
    said lens engaging portion is a hole comprising a bottom with an inside diameter corresponding to an outside diameter of said lens,
    wherein said light guide and said lens are adhered with an adhesive.

12. The light trigger thyristor according to claim 11, wherein said light guide engaging portion has,
    a ring-like first groove along its inner side wall, and
    a ring-like second groove along its bottom rim, and
    said lens engaging portion has,
    a ring-like third groove along its inner side wall, and
    a ring-like fourth groove along its bottom rim,
    wherein said first and third grooves are filled with said adhesive.

13. The light trigger thyristor according to claim 10, wherein said light guide engaging portion is a hole with a bottom having its inside diameter corresponding to an outside diameter of said light guide, and
    said lens engaging portion is a hole with a bottom having its inside diameter corresponding to an outside diameter of said lens, wherein said light guide and said lens are fixed by uniformly applying pressure to said sleeve inwardly from the outside to inwardly compress said sleeve.

14. The light trigger thyristor according to claim 10, wherein said sleeve has at least one through hole extending from its peripheral surface to reach said gap.

15. The light trigger thyristor according to claim 14, wherein said sleeve has at least one first through hole extending from its peripheral surface to reach said light guide engaging portion and at least one second through hole extending to reach said lens engaging portion.

16. The light trigger thyristor according to claim 1, further comprising a reflection preventing film on said light entering end of said light guide and both surfaces of said lens.

* * * * *